United States Patent
Panpaliya et al.

(10) Patent No.: US 8,914,699 B2
(45) Date of Patent: Dec. 16, 2014

(54) METHOD AND APPARATUS FOR RESTRICTING RADIO ACCESS TO A SYSTEM

(75) Inventors: Satyanarayan R. Panpaliya, Palatine, IL (US); Thomas B. Bohn, McHenry, IL (US); Dipendra M. Chowdhary, Hoffman Estates, IL (US); David G. Wiatrowski, Woodstock, IL (US); Zhijun Zhu, South Barrington, IL (US); Stephen Lee, Sichuan (CN); Grace Zhong, Chengdu (CN); Rui Yang, Sichuan (CN)

(73) Assignee: Motorola Solutions, Inc., Schaumburg, IL (US)

( * ) Notice: Subject to any disclaimer, the term of this patent is extended or adjusted under 35 U.S.C. 154(b) by 242 days.

(21) Appl. No.: 13/459,882

(22) Filed: Apr. 30, 2012

(65) Prior Publication Data
US 2013/0288643 A1 Oct. 31, 2013

(51) Int. Cl.
*H03M 13/00* (2006.01)
*H04L 1/00* (2006.01)
*H03M 13/13* (2006.01)
*H04N 21/6375* (2011.01)

(52) U.S. Cl.
CPC .............. *H04L 1/0061* (2013.01); *H03M 13/13* (2013.01); *H04N 21/6375* (2013.01)
USPC ............ 714/758; 455/411; 455/423; 711/167

(58) Field of Classification Search
CPC ....... H04L 1/0061; H04L 45/00; H04L 45/30; H04L 45/54; H04L 49/25; H04L 49/254; H04L 49/30; H04L 49/3009; G11B 20/1833; H03M 13/13; H04B 7/2681; H04M 1/72505; H04N 21/44227; H04N 21/6375; H04N 21/6583; H04Q 11/0066; H04Q 11/0071; H04Q 2011/0064; H04Q 2011/0084; H04W 56/0085

USPC ............ 714/758–759; 711/167; 455/411, 423
See application file for complete search history.

(56) References Cited

U.S. PATENT DOCUMENTS 5,020,051 A * 5/1991 Beesley et al. ................ 370/280
6,411,614 B1 * 6/2002 Weigand ........................ 370/347
(Continued)

FOREIGN PATENT DOCUMENTS

JP 2002124952 A 4/2002

OTHER PUBLICATIONS

PCT International Search Report Dated June 26, 2013 for Counterpart Application PCT/US2013/035062.

(Continued)

*Primary Examiner* — Guy LaMarre
(74) *Attorney, Agent, or Firm* — Barbara R. Doutre

(57) ABSTRACT

A first subscriber unit (SU) operating in a two-way radio frequency (RF) communications system having at least one fixed terminal, one or more channels, and a plurality of subscriber units, generates a first burst of data for transmission to the at least one fixed terminal. The first SU calculates a cyclic redundancy check (CRC) or checksum value over (i) at least a first portion of the first burst of data and (ii) at least a portion of a first private data. The first SU transmits the first burst of data and the calculated CRC/checksum value, but not the first private data, to the at least one fixed terminal. The fixed terminal then calculates its own CRC/checksum over the received burst and its own copy of the first private data, and compares the result with the received CRC/checksum. The fixed terminal authenticates the received burst if the values match.

18 Claims, 9 Drawing Sheets

(56) References Cited

U.S. PATENT DOCUMENTS

| | | | |
|---|---|---|---|
| 6,721,315 B1 * | 4/2004 | Xiong et al. | 370/389 |
| 6,976,168 B1 | 12/2005 | Branstad et al. | |
| 7,096,359 B2 | 8/2006 | Agrawal et al. | |
| 7,146,478 B2 * | 12/2006 | Herkerdorf et al. | 711/167 |
| 7,266,682 B2 | 9/2007 | Euchner | |
| 7,305,084 B2 | 12/2007 | Hawkes et al. | |
| 7,774,677 B2 | 8/2010 | Mouffron et al. | |
| 2004/0250061 A1 | 12/2004 | Yamauchi et al. | |
| 2007/0067634 A1 | 3/2007 | Siegler | |
| 2007/0127458 A1 | 6/2007 | Small et al. | |
| 2007/0234170 A1 * | 10/2007 | Shao et al. | 714/746 |
| 2010/0246382 A1 | 9/2010 | Yi et al. | |

OTHER PUBLICATIONS

Krishna Balachandran, et al. "Design of a Medium Access Control Feedback Mechanism for Cellular TDMA Packet Data Systems", IEEE Journal on Selected Areas in Communications, IEEE Service Center, Piscataway, USA, vol. 18, No. 9, Sep. 1, 2009, XP011055200, ISSN:0733-8716, D0I; 10.1109/49.887909 Section III. Implicit Addressing.

* cited by examiner

METHOD AND APPARATUS FOR RESTRICTING RADIO ACCESS TO A SYSTEM

FIELD OF THE DISCLOSURE

The present disclosure relates generally to restricting access of mobile stations to a radio network to those mobile stations authorized to access the radio network.

BACKGROUND OF THE DISCLOSURE

Wireless communication systems provide for radio communication links to be arranged within the system between a plurality of user terminals. Such user terminals may be mobile and may be known as 'mobile stations' or 'subscriber units.' At least one other terminal, e.g. used in conjunction with subscriber units, may be a fixed terminal, e.g. a control terminal, base station, repeater, and/or access point. Such a system typically includes a system infrastructure which generally includes a network of various fixed terminals, which are in direct radio communication with the subscriber units. Each of the base stations operating in the system may have one or more transceivers which may, for example, serve subscriber units in a given local region or area, known as a 'cell' or 'site', by radio frequency (RF) communication. The subscriber units that are in direct communication with a particular fixed terminal are said to be served by the fixed terminal. In one example, all radio communications to and from each subscriber unit within the system are made via respective serving fixed terminals. Sites of neighboring fixed terminals in a wireless communication system may be offset from one another or may be non-overlapping or partially or fully overlapping. In another example in which subscriber units can operate in a direct mode (e.g., without having to pass through a repeater or base station), a fixed terminal such as a control terminal may provide for a mechanism to update the direct mode subscriber units with new program settings, channels, groups, etc.

Wireless communication systems may operate according to an industry standard protocol such as, for example, the Project 25 (P25) standard defined by the Association of Public Safety Communications Officials International (APCO), or other radio protocols, such as the TETRA standard defined by the European Telecommunication Standards Institute (ETSI), the Digital Private Mobile Radio (dPMR) standard also defined by the ETSI, or the Digital Mobile Radio (DMR) standard also defined by the ETSI. Communications in accordance with any one or more of these standards, or other standards, may take place over physical channels in accordance with one or more of a TDMA (time division multiple access), FDMA (frequency divisional multiple access), or CDMA (code division multiple access) protocol. Subscriber units in wireless communication systems such as those set forth above send user communicated speech and data, herein referred to collectively as 'traffic information', in accordance with the designated protocol.

Many so-called "public safety" wireless communication systems provide for group-based radio communications amongst a plurality of subscriber units such that one member of a designated group can transmit once and have that transmission received by all other members of the group substantially simultaneously. Groups are conventionally assigned based on function. For example, all members of a particular local police force may be assigned to a same group so that all members of the particular local police force can stay in contact with one another, while avoiding the random transmissions of radio users outside of the local police force.

Such wireless communication systems may provide methods that allow an administer to selectively restrict access of a subscriber unit to the system, preventing an unauthorized subscriber unit from accessing to and/or monitoring communications over the air that it does not have authorization to access or monitor. Prior methods have generally relied on authenticating the subscriber unit during its registration with the system. In such methods, a session key is derived during the registration process and the subscriber unit uses the session key to authenticate itself on the start of a call or communication session. A system that deploys authentication only during the registration process, however, does not completely prevent access to the system by an unauthorized subscriber unit. For example, the system may allow an unauthorized subscriber unit to access the system when the unauthorized subscriber unit uses the same ID as a subscriber unit already registered in the system (e.g., the unauthorized subscriber unit spoofs the already registered subscriber unit). Furthermore, a system that deploys authentication on the start of a call delays the start of the call because the authentication requires one or more exchanges of additional information before any call or communication session can be started. Another limitation of the use of pre-call authentication is that the authentication does not stop, or attempt to prevent, an unauthorized subscriber unit from listening to an established call.

Accordingly, a system and method is needed for digital two-way radio systems to restrict system access to its own subscriber units with minimum overhead, while preventing unauthorized subscriber units from listening to an established call, without the additional timing overhead of a registration/authentication process, and without allowing an unauthorized subscriber unit using a duplicate subscriber unit ID to use the system.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DISCLOSURE

In light of the foregoing, it would be advantageous to provide for a system and method that restricts radio system access to its own subscriber units with minimum overhead, while preventing unauthorized subscriber units from participating in or listening to an established call, without the additional timing overhead of a registration/authentication process.

In one embodiment, a first subscriber unit (SU) operating in a two-way radio frequency (RF) communications system having at least one fixed terminal, one or more channels, and a plurality of subscriber units, generates a first burst of data for transmission to the at least one fixed terminal. The first SU calculates a cyclic redundancy check (CRC) or checksum value over (i) at least a first portion of the first burst of data and (ii) at least a portion of a first private data. The first SU transmits the first burst of data and the calculated CRC/checksum value, but not the first private data, to the at least one fixed terminal.

In a further embodiment, the SU receives a second burst of data from the at least one fixed terminal. The SU calculates a second CRC value or a second checksum value over both (i) at least a first portion of the second burst of data and (ii) at least a portion of a second private data stored locally at the first SU. The SU compares the calculated second CRC/checksum value to a corresponding one of an appended CRC/checksum value appended to the received second burst of data from the at least one fixed terminal. If the one of the calculated second CRC/checksum value matches the corresponding one of the appended CRC/checksum value, the SU authenticates and further decodes the second burst of data, otherwise, the SU refrains from further decoding the second burst of data.

Similarly, the fixed terminal may apply the same processes on data bursts transmitted to and received from all or a subset of SUs operating within its service area.

Each of the above-mentioned embodiments will be discussed in more detail below, starting with example network and device architectures of the system in which the embodiments may be practiced, followed by a discussion of private data concatenation from the point of view of the fixed network equipment and the subscriber unit. Further advantages and features consistent with this disclosure will be set forth in the following detailed description, with reference to the figures.

I. Network and Device Architectures

Figure 1:
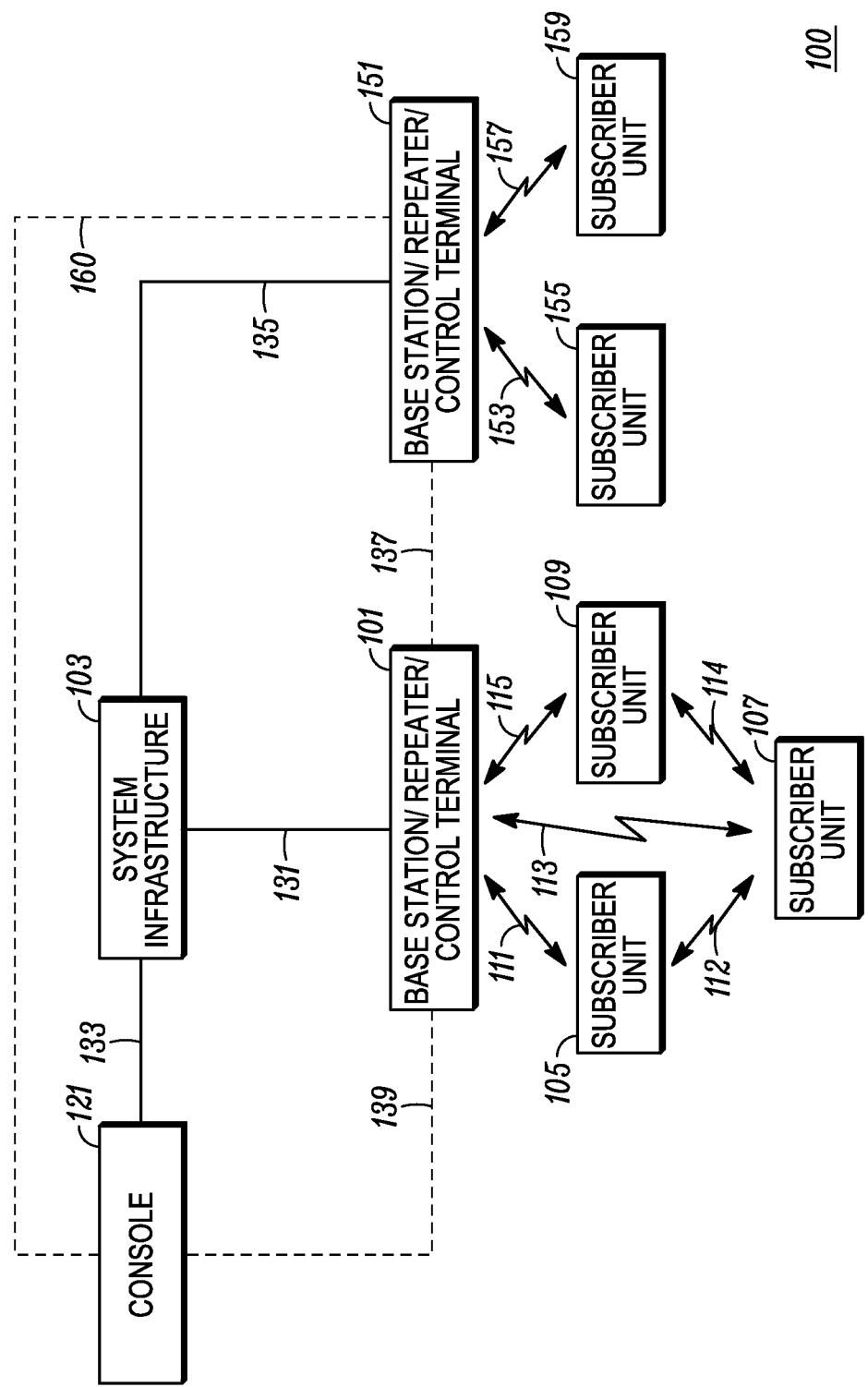
FIG. 1 is a schematic diagram of a wireless communication system in accordance with an embodiment.

FIG. 1 shows a wireless communication system 100 which may be adapted in accordance with an embodiment of the disclosure. It will be apparent to those skilled in the art that the system 100 and the components which are to be described as operating therein may take a number of forms well known to those skilled in the art. Thus, the layout of the system 100, and of its operational components to be described, should be regarded as illustrative rather than limiting. The system 100 of FIG. 1 will be described as an illustrative wireless communication system capable of operating in accordance with any one or more standard protocols, such as the APCO P25 standard, the DMR standard, or the TETRA standard, among other possibilities.

The system 100 shown in FIG. 1 includes one or more fixed terminals (e.g., base stations/repeaters/control terminals) (BSs) 101, 151, which may be operably connected to a system infrastructure 103 via respective wired or wireless links 131, 135. While the term BS will be used to refer to the fixed terminal 101, for ease of reference, it should be noted that the fixed terminal 101 may, in some embodiments, be a repeater or a control terminal, or some other type of fixed terminal. The BS 101 has radio links with a plurality of subscriber units, particularly subscriber units (SUs) in a service cell or site at least partially defined by a geographic location of the BS 101. In addition to SUs, BS 101 may maintain a direct wireless or wired link 139 (or indirect via system infrastructure 103) with a dispatch console 121 or other operator. The dispatch console 121 may be configured to act as a communications client of BS 101, but may also provide administrator control access to BS 101 so that an administrator may update operational parameters at BS 101, including defining or adding private data (and perhaps defining or adding associated private data alias IDs) and bit masks for use in future communications. Three SUs 105, 107, 109 are illustrated in FIG. 1 as being within the service area of, and being registered with, BS 101 via respective radio links 111, 113, 115. In one embodiment, the BS 101 serves SUs including the SUs 105, 107, 109 with radio communications to and from other terminals, including (i) SUs served by the BS 101, (ii) SUs served by other BSs such as BS 151, (iii) other terminals including SUs in other systems (not shown) operably linked to the system 100 via the system infrastructure 103, and (iv) the console 121. In another embodiment in which SUs 105, 107, 109 are operating in a direct communication mode (DCM) via example radio links 112, 114, BS 101 may simply be a control terminal that may be used to provide and or manage private data (and perhaps associated private data alias IDs) and bit masks between DCM SUs 105, 107, 109.

BS 151 similarly has radio links with a plurality of SUs, particularly SUs in a service cell or site at least partially defined by a geographic location of the BS 151. In addition to SUs, BS 151 may maintain a direct wireless or wired link 160 (or indirect via system infrastructure 103) with the dispatch console 121 or other operator. The dispatch console 121 may be configured to act as a communications client of BS 151, but may also provide administrator control access to BS 151 so that an administrator may update operational parameters at BS 151, including defining or adding private data (and perhaps defining or adding associated private data alias IDs) and bit masks for use in future communications. Two SUs 155, 159 are illustrated in FIG. 1 as being within the service area of, and being registered with, BS 151 via respective radio links 153, 157. The BS 151 thereby serves SUs including the SUs 155, 157 with radio communications to and from other terminals, including (i) SUs served by the BS 151, (ii) SUs served by other BSs such as BS 101, (iii) other terminals including SUs in other systems (not shown) operably linked to the system 100 via the system infrastructure 103, and (iv) the console 121. In another embodiment, although not shown, SUs 155, 159 may similarly operate in a DCM, and BS 151 may simply be a control terminal that may be used to provide and or manage private data (and perhaps associated private data alias IDs) and bit masks between DCM SUs 155, 159.

The system infrastructure 103 includes known sub-systems (not shown) required for operation of the system 100. Such sub-systems may include for example sub-systems providing authentication, routing, SU registration and location, system management and other operational functions within the system 100. The system infrastructure 103 may additionally provide routes to other BSs (not shown) providing cells serving other SUs, and/or may provide access to other types of networks such as a plain old telephone system (POTS) network or a data-switched network such as the Internet. The system infrastructure 103 may also maintain a separate link 133 to the console 121 for supporting voice calls to and from the console 121 and/or for allowing configuration of network elements such as BSs 101, 151 within the system infrastructure 103 from the console 121.

Figure 2:
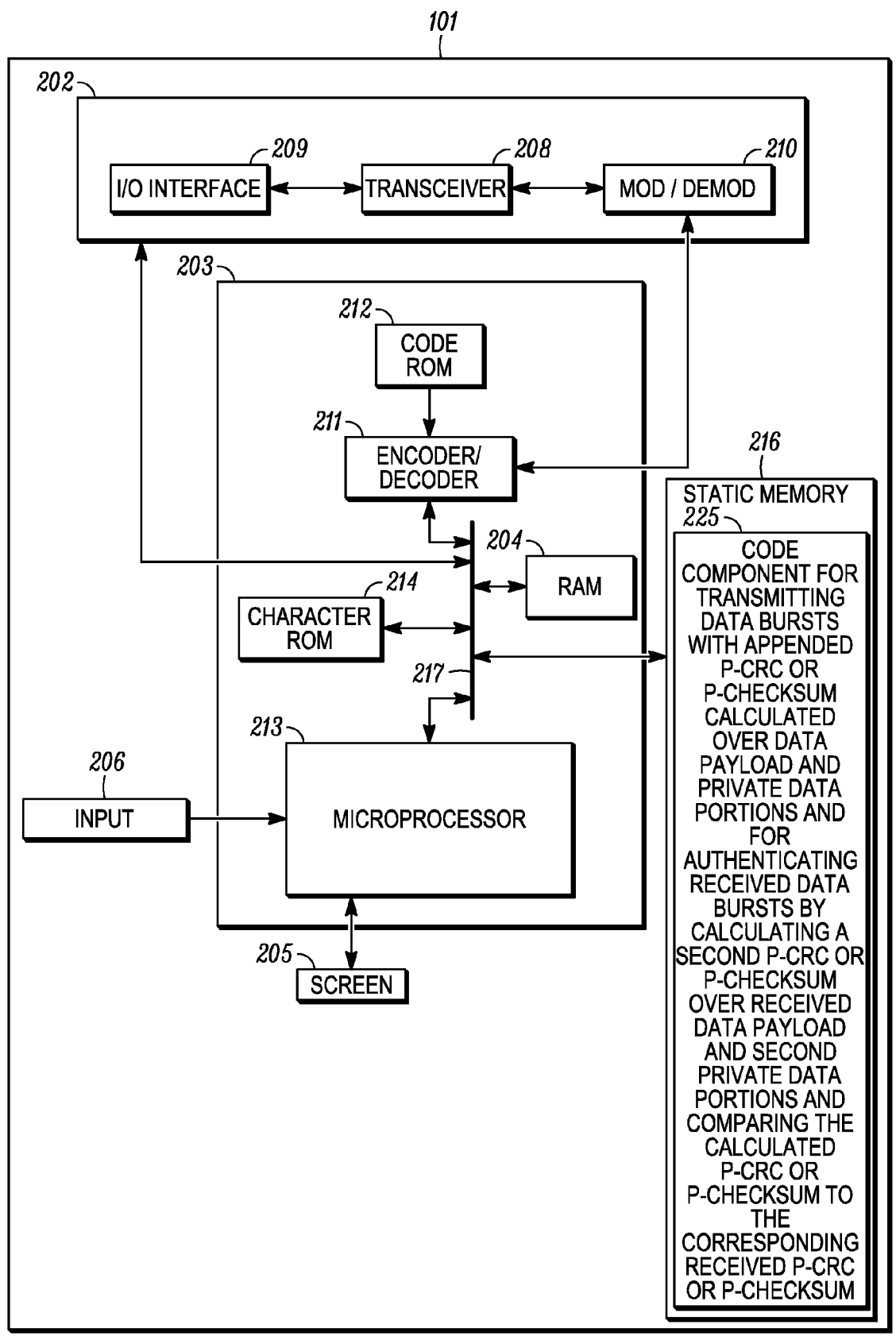
FIG. 2 is a block diagram of an illustrative layout of a base station/repeater/control terminal of the system of FIG. 1 in accordance with an embodiment.

FIG. 2 is an example functional block diagram of a BS such as BS 101 operating within the system 100 of FIG. 1 in accordance with some embodiments. Other BSs such as BS 151 may contain same or similar structures. As shown in FIG. 2, BS 101 includes a communications unit 202 coupled to a common data and address bus 217 of a processing unit 203. The BS 101 may also include an input unit (e.g., keypad, pointing device, etc.) 206 and a display screen 205, each coupled to be in communication with the processing unit 203.

The processing unit 203 may include an encoder/decoder 211 with an associated code Read Only Memory (ROM) 212 for storing data for encoding and decoding voice, data, control, or other signals that may be transmitted or received between other BSs or SUs in the same radio site as BS 101, or perhaps between other BSs in a remote radio site such as BS 151. The processing unit 203 may further include a microprocessor 213 coupled, by the common data and address bus 217, to the encoder/decoder 211, a character ROM 214, a Random Access Memory (RAM) 204, and a static memory 216.

The communications unit 202 may include one or more wired or wireless input/output (I/O) interfaces 209 that are configurable to communicate with SUs such as SUs 105, 107, 109, with other BSs such as BS 151, with the system infrastructure 103, and/or with the console 121. The communications unit 202 may include one or more wireless transceivers 208, such as a DMR transceiver, an APCO P25 transceiver, a TETRA transceiver, a Bluetooth transceiver, a Wi-Fi transceiver perhaps operating in accordance with an IEEE 802.11 standard (e.g., 802.11a, 802.11b, 802.11g, 802.11n), a WiMAX transceiver perhaps operating in accordance with an IEEE 802.16 standard, and/or other similar type of wireless transceiver configurable to communicate via a wireless network. The communications unit 202 may additionally include one or more wireline transceivers 208, such as an Ethernet transceiver, a Universal Serial Bus (USB) transceiver, or similar transceiver configurable to communicate via a twisted pair wire, a coaxial cable, a fiber-optic link or a similar physical connection to a wireline network. The transceiver 208 is also coupled to a combined modulator/demodulator 210 that is coupled to the encoder/decoder 211.

The microprocessor 213 has ports for coupling to the input unit 206 and to the display screen 205. The character ROM 214 stores code for decoding or encoding data such as control channel messages and/or data or voice messages that may be transmitted or received by the BS 101. Static memory 216 may store operating code for the microprocessor 213 that, when executed, transmits data bursts with an appended private cyclic redundancy check (CRC) string or private checksum string calculated over the data burst and a private data (one or more of which may be stored in the static memory 216 as well), and for authenticating received data bursts by calculating a private CRC (P-CRC) or private checksum (P-checksum) over the received data burst and a private data and comparing the calculated P-CRC or P-checksum to a corresponding received P-CRC or P-checksum appended to the received data burst in accordance with one or more of FIGS. 4-9 and corresponding text. Static memory 216 may comprise, for example, a hard-disk drive (HDD), an optical disk drives such as a compact disk (CD) drive or digital versatile disk (DVD) drive, a solid state drive (SSD), a tape drive, a flash memory drive, or a tape drive, to name a few.

Figure 3:
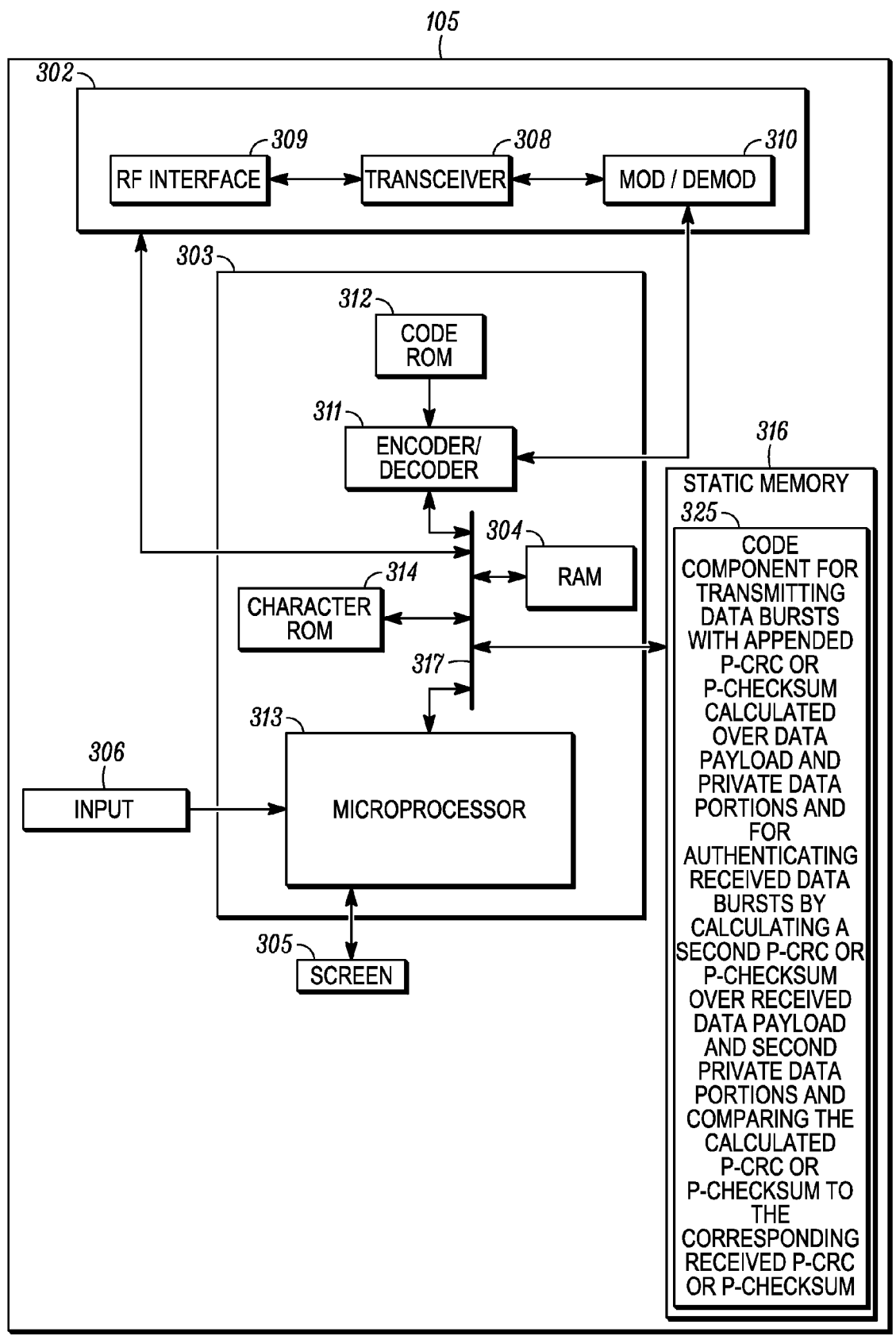
FIG. 3 is a block diagram of an illustrative layout of a subscriber unit of the system of FIG. 1 in accordance with an embodiment.

FIG. 3 is an example functional block diagram of a SU such as SU 105 operating within the system 100 of FIG. 1 in accordance with some embodiments. Other SUs such as SUs 107, 109, 155, and 157 may contain same or similar structures. As shown in FIG. 3, SU 105 includes a communications unit 302 coupled to a common data and address bus 317 of a processing unit 303. The SU 105 may also include an input unit (e.g., keypad, pointing device, etc.) 306 and a display screen 305, each coupled to be in communication with the processing unit 303.

The processing unit 303 may include an encoder/decoder 311 with an associated code Read Only Memory (ROM) 312 for storing data for encoding and decoding voice, data, control, or other signals that may be transmitted or received between other BSs or SUs in the same radio site as BS 101, or perhaps between other BSs in a remote radio site. The processing unit 303 may further include a microprocessor 313 coupled, by the common data and address bus 317, to the encoder/decoder 311, a character ROM 314, a Random Access Memory (RAM) 304, and a static memory 316.

The communications unit 302 may include an RF interface 309 configurable to communicate with other SUs such as SUs 107, 109, 155, 157 and with BSs such as BSs 101, 151. The communications unit 302 may include one or more wireless transceivers 308, such as a DMR transceiver, an APCO P25 transceiver, a TETRA transceiver, a Bluetooth transceiver, a Wi-Fi transceiver perhaps operating in accordance with an IEEE 802.11 standard (e.g., 802.11a, 802.11b, 802.11g, 802.11n), a WiMAX transceiver perhaps operating in accordance with an IEEE 802.16 standard, and/or other similar type of wireless transceiver configurable to communicate via a wireless network. The transceiver 308 is also coupled to a combined modulator/demodulator 310 that is coupled to the encoder/decoder 311.

The microprocessor 313 has ports for coupling to the input unit 306 and to the display screen 305. The character ROM 314 stores code for decoding or encoding data such as control channel messages and/or data or voice messages that may be transmitted or received by the SU 105. Static memory 316 may store operating code for the microprocessor 313 that, when executed, transmits data bursts with an appended P-CRC string or P-checksum string calculated over the data burst and a private data (one or more of which may also be stored in the static memory 316), and for authenticating received data bursts by calculating an P-CRC or P-checksum over the received data burst and a private data and comparing the calculated P-CRC or P-checksum to a corresponding received P-CRC or P-checksum appended to the received data burst in accordance with one or more of FIGS. 4-9 and corresponding text. Static memory 216 may comprise, for example, a HDD, an optical disk drives such as a CD drive or DVD drive, a SSD, a tape drive, a flash memory drive, or a tape drive, to name a few.

II. The Private Data Concatenation Process

FIGS. 4-8 set forth examples of a private data concatenation process that may be executed at a transmitting and receiving device in accordance with some embodiments. While FIGS. 4-8 set forth example communications consistent with the DMR standard (e.g., ETSI-DMR Part 1 TS 102 361-1 V1.4.5, December 2007), the disclosed methods and system are equally applicable to other standard and non-standard based communications that must be transmitted openly over-the-air and secured from potential eavesdropping or malicious devices. For example, while FIGS. 4-8 disclose a control signaling block (CSBK) data burst example that includes a 2 octet header and 8 octet data payload consistent with the DMR standard, the disclosed methods and system are equally applicable to other sizes and lengths of encrypted or unencrypted headers and payloads, including a header-only burst or a payload-only burst. Furthermore, the data payload in FIGS. 4-8 could be any payload, including but not limited to further control or signaling (source and/or destination addresses, group IDs, end of data or further data indications, etc.), media data (digitized voice data, image data, video data, etc.), or any other type of payload. The bursts disclosed in FIGS. 4-8 may be transmitted entirely or mostly intact and in a single contiguous or mostly contiguous transmission, or may be divided and embedded within other transmissions and reassembled at the receiving device (including, for example, as an Embedded Link Control frame divided across a plurality of voice bursts consistent with the DMR standard.

Figure 4:
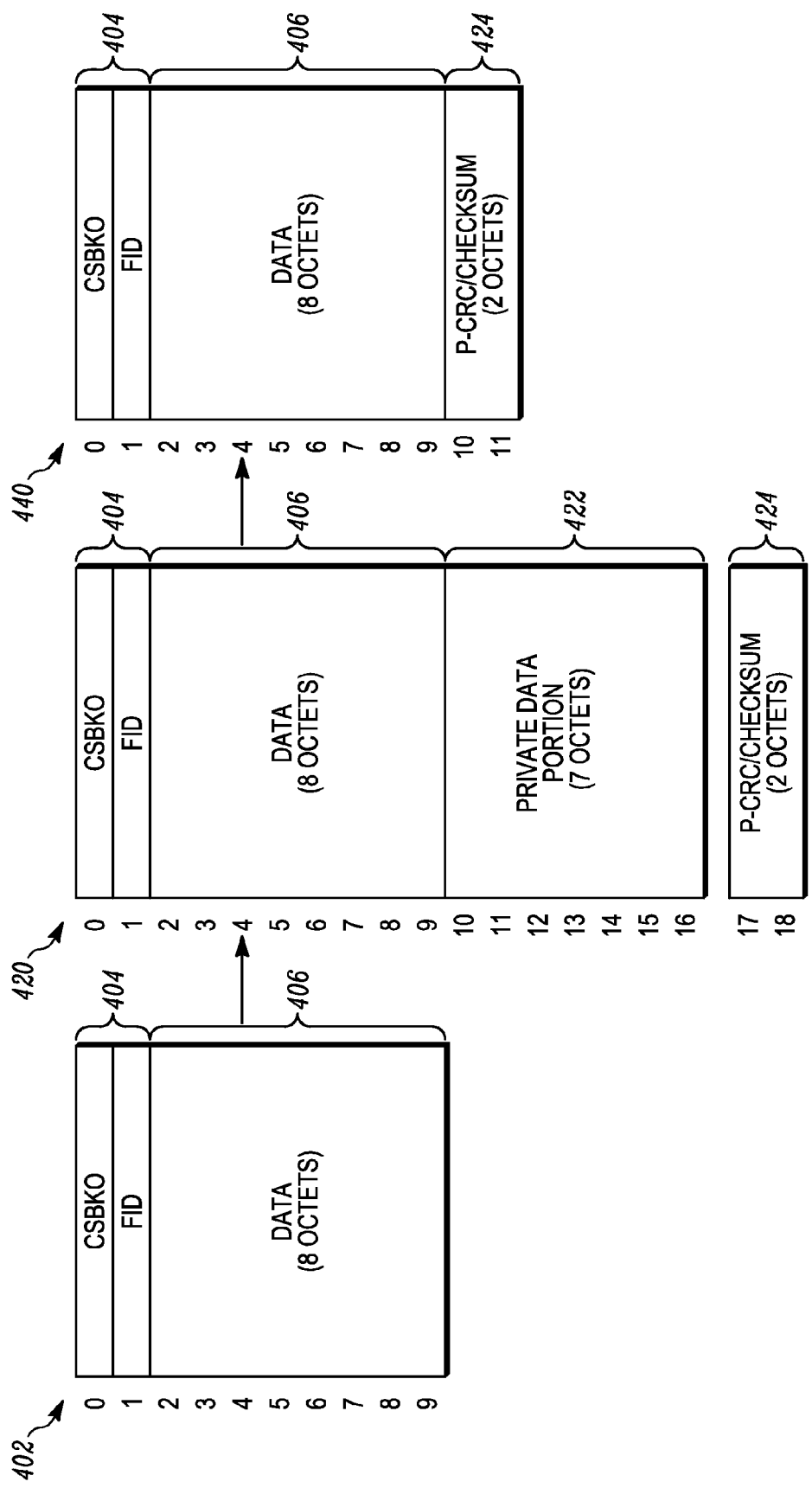
FIG. 4 is a block diagram illustrating an example private data concatenation process implemented at a transmitting device that may be implemented in the system of FIG. 1 in accordance with an embodiment.

As set forth in FIG. 4, a burst of data 402 may consist of a CSBK consistent with the DMR standard and may include a header portion 404 and a data portion 406. The header portion 404 may include a plurality of fields including a control signaling block opcode (CSBKO) field that defines the purpose and format of the burst, and a feature set ID field FID that identifies one or more manufacturer specific feature sets. The data portion 406 may include data consistent with the CSBKO, and may comprise, for example, source and/or destination addresses, group IDs, additional control or signaling fields, digitized voice data, media data, or other types of data. The data burst 402 may be generated at a SU or BS in response to an internally generated trigger (e.g., receipt of voice from a microphone or from some other SU or network entity), in response to a previously received communication (e.g., service request, authorization request, authorization response, location update, etc.), or for some other reason.

An intermediate modified burst 420 is then created by appending a private data portion 422 to an end of the data portion 406. The private portion could be comprised of a pre-defined arrangement and number of binary, decimal, hexadecimal, or other character encodings that preferably has high entropy (e.g., low amount of repetition of the same character sequences, a large character set to choose from, etc.). The private data portion 422 may be populated with all or a portion of one or more locally-stored private data that are provisioned at the transmitting device during a provisioning or configuration process, before the transmitting device is released into the field for general use.

Of course, the entire or sub-portions of the private data portion 422 could additionally or alternatively be inserted in-between the header portion 404 and the data portion 406 or at some pre-determined point within the data portion 406. After appending the private data portion 422, an P-CRC or P-checksum is calculated over at least a portion of the header portion 404 and the data portion 406 and at least a portion of the private data portion 422. The calculated P-CRC or P-checksum value is then populated into an P-CRC/checksum field 424. The size of the resultant P-CRC or P-checksum value can be varied based on the size of the input string to the CRC or checksum algorithm and the particular CRC or checksum algorithm used. In one example, a CRC-CCITT polynomial may be used in the CRC calculation to generate a 2 octet P-CRC value over the data portion 406 and private portion 422 that can then be appended to the end of the data portion 406 (with the private portion 422 removed) in a final P-CRC/checksum field 424 to generate a final data burst 440 for transmission. In other examples, where a different-sized CRC value is desired, for example, CRC-8, CRC-9, or CRC-32 polynomials could be used. In other examples, a reed solomon (RS) algorithm may be used to generate P-CRC detection words that may be appended to the data portion 406. In this case, for example, a RS(19,17) algorithm may be used to generate a 2 octet P-CRC detection word that may be appended to the data portion 406 via P-CRC/checksum field 424. Other polynomials and algorithms could be used as well. In the case of an applied checksum algorithm, various checksum algorithms could be used including a longitudinal parity check or a modular sum, among others, to generate a P-checksum that would serve the same purpose as the P-CRC.

The label P-CRC is somewhat of a misnomer as the P-CRC is actually transmitted in the clear, over-the-air, and is thus not truly "private." Instead, the "private" prefix to the CRC term applies to the process in which the CRC was created, e.g., applied over both the data traditionally subject to the CRC calculation (the actual transmitted data), and a private portion of data (the private data portion) that is not transmitted (and is never transmitted) along with the P-CRC calculation.

Accordingly, despite the addition of the private data portion 422 in the calculation of the P-CRC or P-checksum value for the P-CRC/checksum field 424, the final data burst 440 will still comply with the DMR standard, although the data burst will fail any CRC or checksum test applied by a receiving device that is not privy to the private data, and will result in a denial of service.

By repurposing the CRC/checksum field in the final data burst 440 not only to determine the validity and/or integrity of the data burst 402, but also the authenticity of the data burst 402 (and hence the transmitting device), the CRC/checksum acquires a dual purpose and can be used to prevent unauthorized radio devices from operating in a radio system. It is important to note that, without knowledge of the private data portion 422 used to calculate the P-CRC or P-checksum, any authentication, validity, and/or integrity check conducted at a receiving device on the final data burst 440 will fail, and according to the DMR standard, and many other standards, prevent the receiving radio from further processing the data burst and prevent the transmitting radio from further accessing or monitoring the radio system.

Figure 5:
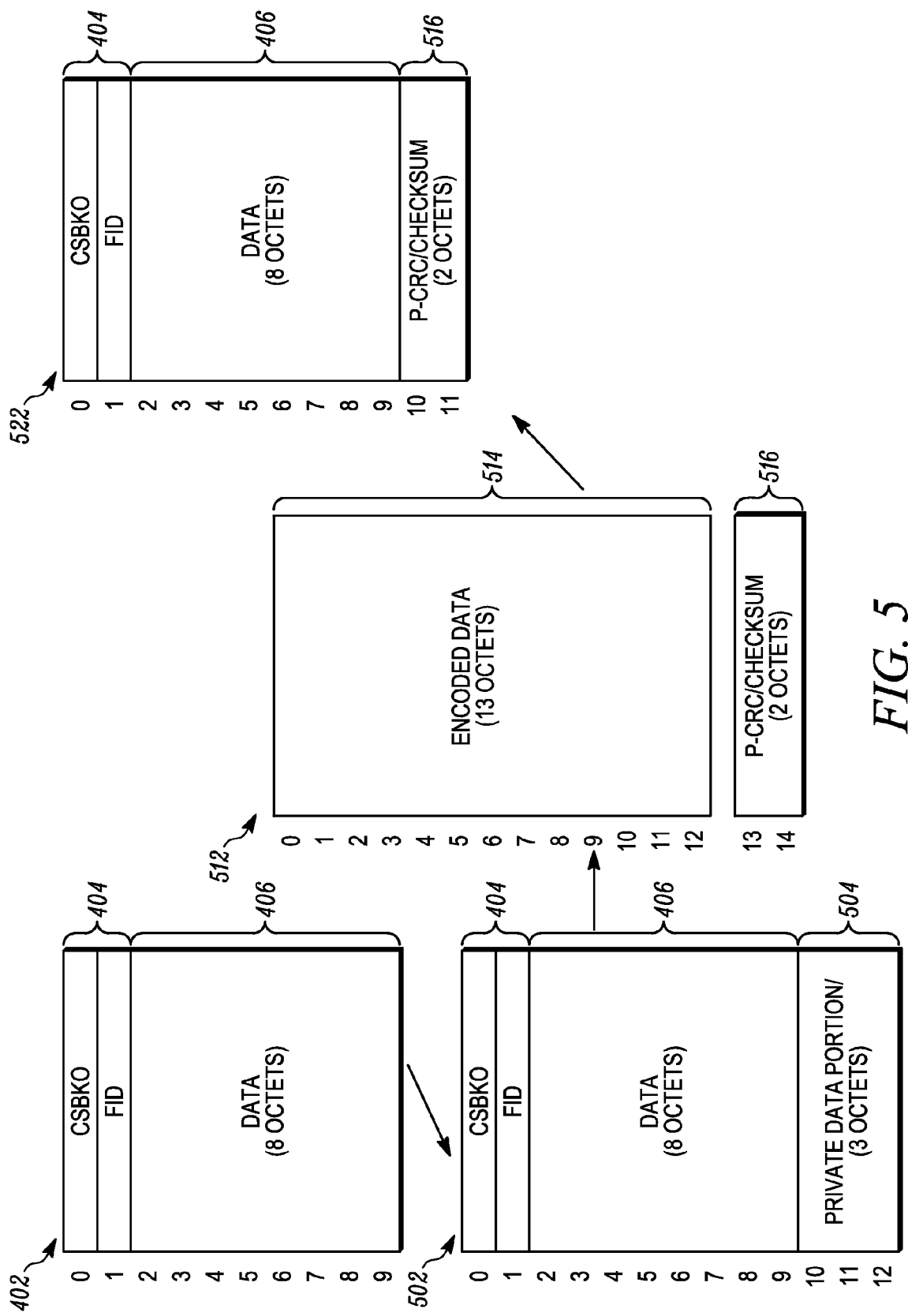
FIG. 5 is a block diagram illustrating an example private data concatenation and encoding process implemented at a transmitting device that may be implemented in the system of FIG. 1 in accordance with an embodiment.

FIG. 5 illustrates an alternative encoding scheme that adds an additional obfuscation step that may be especially useful in those cases (such as with an Embedded Link Control) that a lower order CRC and/or checksum algorithm is used, perhaps due to bandwidth, processing power, or power consumption constraints, or perhaps in those cases where a higher-order CRC and/or checksum algorithm can still be used and a more robust and secure authentication process is desired. While the encoding scheme set forth in FIG. 5 may be applicable to Embedded LC, the example of FIG. 5 continues with the CSBK structure from FIG. 4 for ease of illustration and comparison. Of course, as with all of the examples set forth in this disclosure, other messaging structures consistent with other protocol standards could be used in place of the CSBK/DMR standard messaging examples used here. In FIG. 5, similar reference characters are used with respect to FIG. 4 where possible, and their description is not repeated here.

As set forth in FIG. 5, a burst of data 402 to be transmitted from a transmitting device may include a CSBK consistent with the DMR standard and may include a header portion 404 and a data portion 406, as already set forth with respect to FIG. 4. However, in contrast to the process set forth in FIG. 4, and in this example, a first intermediate modified burst 502 is created by appending a first portion of one or more locally-stored private data as a private data portion 504 to an end of the data portion 406. The private portion could be comprised of a pre-defined arrangement and number of binary, decimal, hexadecimal, or other character encodings that preferably has high entropy (e.g., low amount of repetition of the same character sequences, a large character set to choose from, etc.). For example, for a 56-bit locally-stored private data, the first portion could comprise a 24 most significant bits (3 most significant bytes) of the private data populated into the private data portion 504. In other examples, the entire 56-bit private data could be appended, or the 24 least significant bits could be appended, among other options. Larger or smaller private data could be used as well.

Of course, the entire or sub-portions of the private data portion 504 could additionally or alternatively be inserted in-between the header portion 404 and the data portion 406 or at some pre-determined point within the data portion 406. After appending the private data portion 504, a second intermediate modified burst 512 is then created by encoding at least a portion of (or all of) the header portion 404, data portion 406, and private portion 504 as a function of a second portion of the locally-stored private data or all or a portion of a second locally-stored private data. In the example set forth above, the second portion of the locally-stored private data could be the 32 least significant bits. In other examples, the second portion of the locally-stored private data could be the 32 most significant bits. Other combinations are possible as well, and the first and second portions of the private data may partially or entirely overlap. In at least some embodiments, the second intermediate modified burst 512 may be created by encoding at least the portion of (or all of) the header portion 404, data portion 406, and private portion 504 as a function of all or a portion of a second private data that may also be locally-stored at the transmitting device.

Various encoding algorithms could be used to create the encoded data portion 514 of the second intermediate modified burst 512. In one example, the second portion of the locally-stored private data could define mappings between characters appearing in the header portion 404, data portion 406, and/or the private data portion 504 and replacement characters that would be inserted in their place in the encoded data portion 514. In another example, the encoded data portion 514 may reflect a circular shift of the characters appearing in the header portion 404, data portion 406, and/or the private data portion 504, including a pre-defined intervening string of characters that could be shifted into the header portion 404, the data portion 406, and/or the private data portion 504 depending on a shift value stored elsewhere in the second portion of the locally-stored private data, or in the second private data, and which may determine a direction of the circular shift and amount of circular shift.

In a still further example, the 2 bytes of header data in the header portion 404, the 8 bytes (octets) of payload data in the data portion 406, and the 3 bytes of private data in the private data portion 504 (13 bytes total, 104 bits) may be concatenated to form a 104-bit interleaved data ring. A value stored in the second portion of the locally-stored private data (or in the second private data) may provide a count value that defines an extraction period in a clockwise or counterclockwise direction (extraction direction) around the data ring. The encoded data portion 514 is then constructed as bits are extracted from the interleaved data ring in accordance with the count value and a predefined extraction direction. For example, if position 0 occurs at the 12:00 position in the ring, and the count proceeds in a clockwise manner and ends at 103 (after which position 0 is reached again), and the count value stored in the second portion of the locally-stored private data is 4, the sequence of the encoded bits in the encoded data portion 514 in the second intermediate modified burst 512 would be (relative to their position in the first intermediate modified burst 502): 3, 7, 11, 15, ..., 99, 103, 4, 9, ..., 100, 1, 8, 16, 22, ... etc.

An P-CRC or P-checksum is then calculated over the entire encoded data portion 514. A resultant P-CRC or P-checksum value is then populated into a P-CRC/checksum field 516. As already set forth earlier, the size of the resultant P-CRC or P-checksum value can be varied based on the size of the input string to the CRC or checksum algorithm, and the particular CRC or checksum algorithm used. The P-CRC/checksum field 516 includes a value that, according to standard, is used to determine the validity and/or integrity of the data burst 402 (or at least the payload portion 406 of the data burst 402). However, by repurposing the CRC/checksum value in the final data burst 522 not only to determines the validity and/or integrity of the data burst 402, but also the authenticity of the data burst (and hence the transmitting device), the CRC/checksum acquires a dual purpose and can be used to prevent unauthorized radio devices from operating in a radio system. It is important to note that, without knowledge of the private data portion 504, or of the particular encoding process used to create the encoded data portion 514, any authentication, validity, and/or integrity check conducted at a receiving device on the final data burst 522 will fail, and according to the DMR standard, and other standards, prevent the receiving radio from further processing the data burst and prevent the transmitting radio from further accessing or monitoring the radio system.

Figure 6:
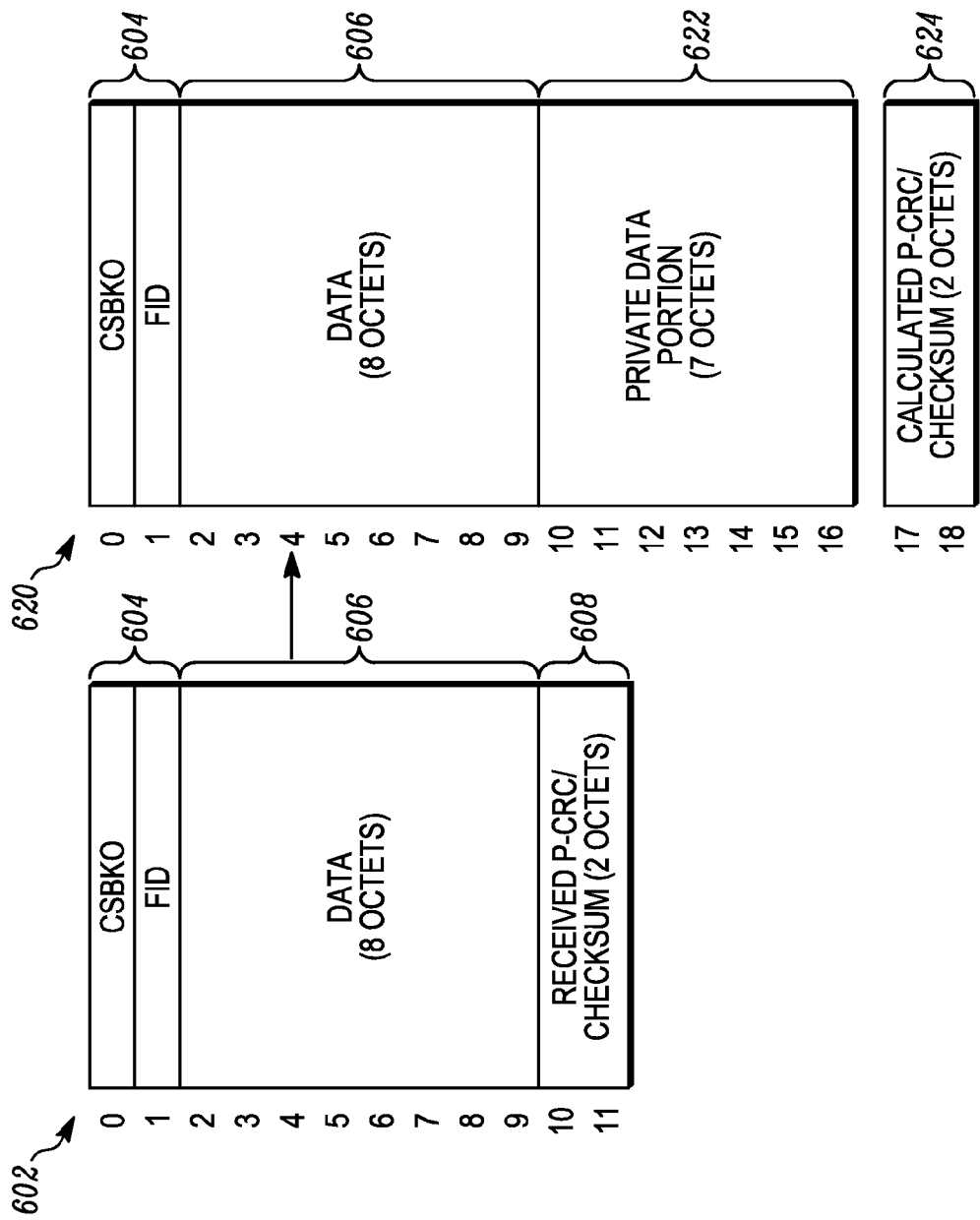
FIG. 6 is a block diagram illustrating an example private data concatenation process implemented at a receiving device to authenticate a received data burst that may be implemented in the system of FIG. 1 in accordance with an embodiment.

FIG. 6 illustrates an example data burst authentication process that may be applied to a received data burst at a receiving SU or BS in order to authenticate the received data burst and ensure that the data burst was transmitted by a SU or BS authorized to operate in the radio system in which the receiving SU or BS is operating. A received burst 602 includes a header portion 604 similar to the header portion 404 of FIG. 4, a data portion 606 similar to the data portion 406 in FIG. 4, and a received P-CRC or P-checksum value in an P-CRC/checksum field 608 similar to the P-CRC/checksum field 424 in FIG. 4. The receiving device will then append the same private data portion 622 at the same location in the received data burst 602 as was appended by the transmitting device at the intermediate data burst 420 (in this case, immediately following the data portion 606), and separately calculate a second P-CRC or P-checksum over at least a portion of the data portion 606 and at least a portion of the private data portion 622 using the same CRC or checksum algorithm as the transmitting device. The resultant calculated P-CRC or P-checksum value will then be compared to the received P-CRC or P-checksum value contained in the P-CRC/checksum field 624. If the received P-CRC or P-checksum value matches the respective calculated second P-CRC or P-checksum value, the receiving device will consider the received data burst 602 to be authenticated and allow further processing of the received data burst 602. In the case of a BS, this could mean repeating the receiving transmission to other subscribers (locally and/or via remote BSs). In the case of a SU, this could mean further processing the received transmission, including playing back received media (audio and/or video) included in the received transmission. On the other hand, if the received P-CRC or P-checksum value does not match the respective calculated second P-CRC or P-checksum value, the receiving device will consider the received data burst 602 to be inauthentic and disallow further processing of the received data burst 602, consistent with the remainder of this disclosure. In the case of a BS, this could mean not repeating the receiving transmission to other subscribers (locally and/or via remote BSs). In the case of a SU, this could mean refraining from further processing the received transmission, including not playing back received media (audio and/or video) included in the received transmission.

Figure 7:
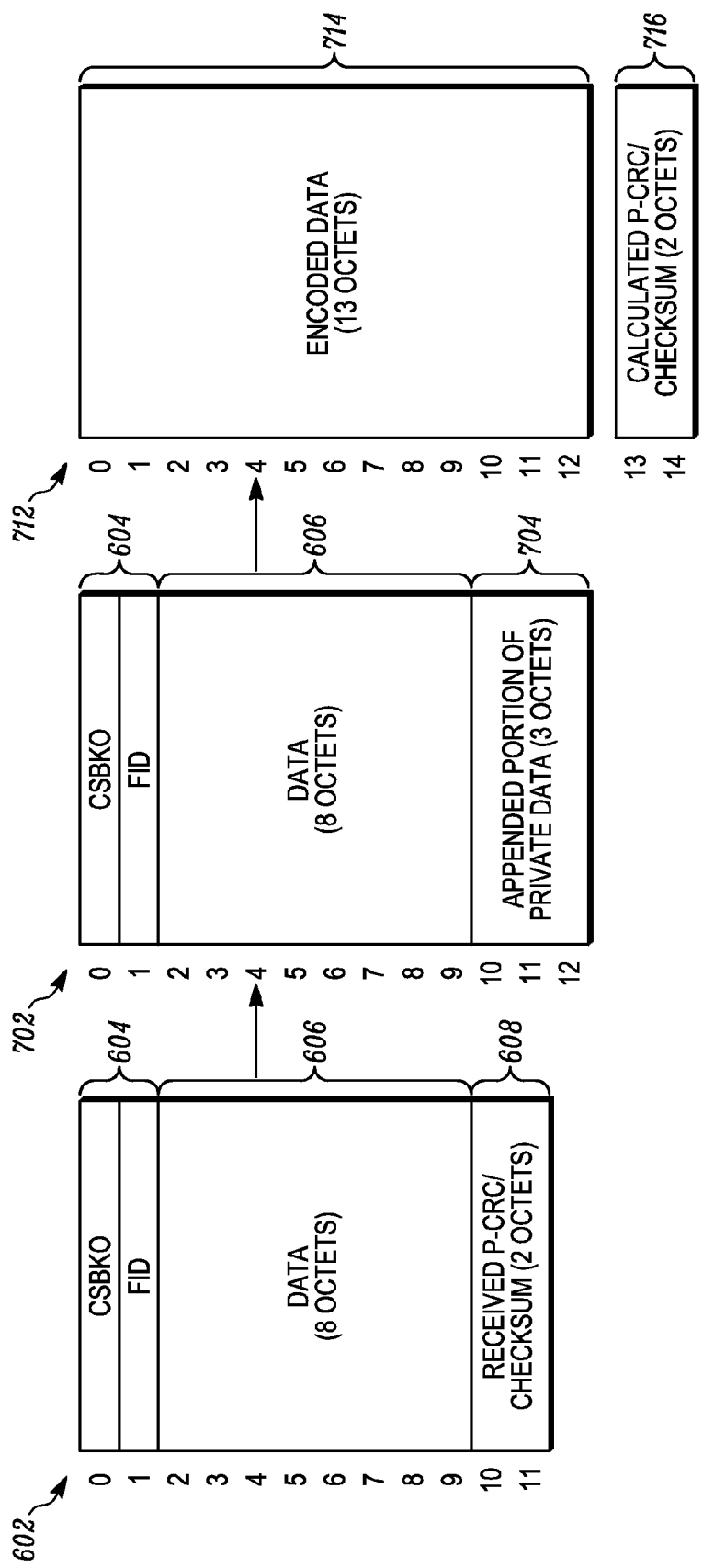
FIG. 7 is a block diagram illustrating an example private data concatenation and encoding process implemented at a receiving device to authenticate a received data burst that may be implemented in the system of FIG. 1 in accordance with an embodiment.

FIG. 7 illustrates an example data burst authentication process commensurate with the encoding scheme of FIG. 5 that added an additional obfuscation step that may be especially useful in those cases (such as with an Embedded LC) that a lower order CRC or checksum algorithm must be used or where a more robust security is desired using a higher order CRC or checksum algorithm. While the process set forth in FIG. 7 may be particularly useful for Embedded LC, FIG. 7 continues with the example using a CSBK for ease of comparison to the processes already set forth above. Accordingly, similar reference characters are used with respect to FIG. 5 where possible, and their description is not repeated here.

The example data burst authentication process of FIG. 7, similar to the process described in FIG. 6, may be applied to a received data burst at a receiving SU or BS in order to authenticate the received data burst and ensure that the data burst was transmitted by a SU or BS authorized to operate in the radio system in which the receiving SU or BS is operating, with the additional caveat that a data encoding step must be inserted to mimic the additional data encoding set forth above in the transmitting device in FIG. 5.

Similar to FIG. 6, a received data burst 602 includes a header portion 604 similar to the header portion 404 of FIG. 4, a data portion 606 similar to the data portion 406 in FIG. 4, and a received P-CRC or P-checksum value in an P-CRC/checksum field 608 similar to the P-CRC/checksum field 424 in FIG. 4. The receiving device will then append the same private data portion 704 at the same location in the received data burst as was appended by the transmitting device at the transmitting device's first intermediate data burst 502 (in this case, immediately following the data portion 606) to create a receiving device first local intermediate data burst 702.

As already set forth earlier, the content of the private data portion could vary, but in any event, should be the same at the receiving device as was used at the transmitting device. For example, and similar to that already set forth above, for a 56-bit private data, the private data portion 704 could comprise a 24 most significant bits (3 most significant bytes) of a predetermined locally stored private data stored in a memory at the receiving device.

After appending the private data portion 704, a second intermediate modified burst 712 is then created at the receiving device by encoding at least a portion of (or all of) the header portion 604, the data portion 606, and/or private portion 704 as a function of a second portion of the locally-stored private data or a portion of another locally-stored private data. In the example set forth above, the second portion of the locally-stored private data could be the 32 least significant bits, and in any event, should be a same portion of the locally-stored private data as was used at the transmitting device.

Various encoding algorithms could be used to create the encoded data portion 714 of the second intermediate modified burst 712, in any one or more manners as already set forth above, with the caveat that the encoding algorithm at the receiving device should match the encoding algorithm used at the transmitting device. In any event, after encoding, the encoded data portion 714 is different from the header portion 604, data portion 606, and private portion 704.

A P-CRC or P-checksum is then calculated over the entire encoded data portion 714. A resultant calculated P-CRC or P-checksum value is then populated into a calculated P-CRC/checksum field 716. The calculated P-CRC or P-checksum value in the calculated P-CRC/checksum field 716 can then be compared to the received P-CRC or P-checksum value in the received P-CRC/checksum field 608. If there is a match, the received data burst 602 is authenticated and is further processed by the receiving device. If there is not a match, the received data burst 602 is dropped and, in some embodiments, a notice that the received data burst 602 failed authentication sent back to the transmitting device. The notice sent back to the transmitting device may be, for example, a negative acknowledgment (NACK) message.

By repurposing the CRC/checksum value in the received CRC/checksum field of the received data burst to not only to determine the integrity of the data burst, but also the authenticity of the data burst (and hence the transmitting device), the CRC/checksum acquires a dual purpose and can be used to prevent unauthorized radio devices from operating in a radio system. It is important to note that, without knowledge of the correct private data portion 704 used to calculate the P-CRC or P-checksum at the transmitting device, or of the particular encoding process used to create the encoded data portion 714 at the transmitting device, any authentication and/or integrity check conducted at a receiving device on the received data burst 602 will fail, and according to the DMR standard, and other standards, prevent the transmitting device from further accessing the radio system and the receiving device from further monitoring the radio system.

Figure 8:
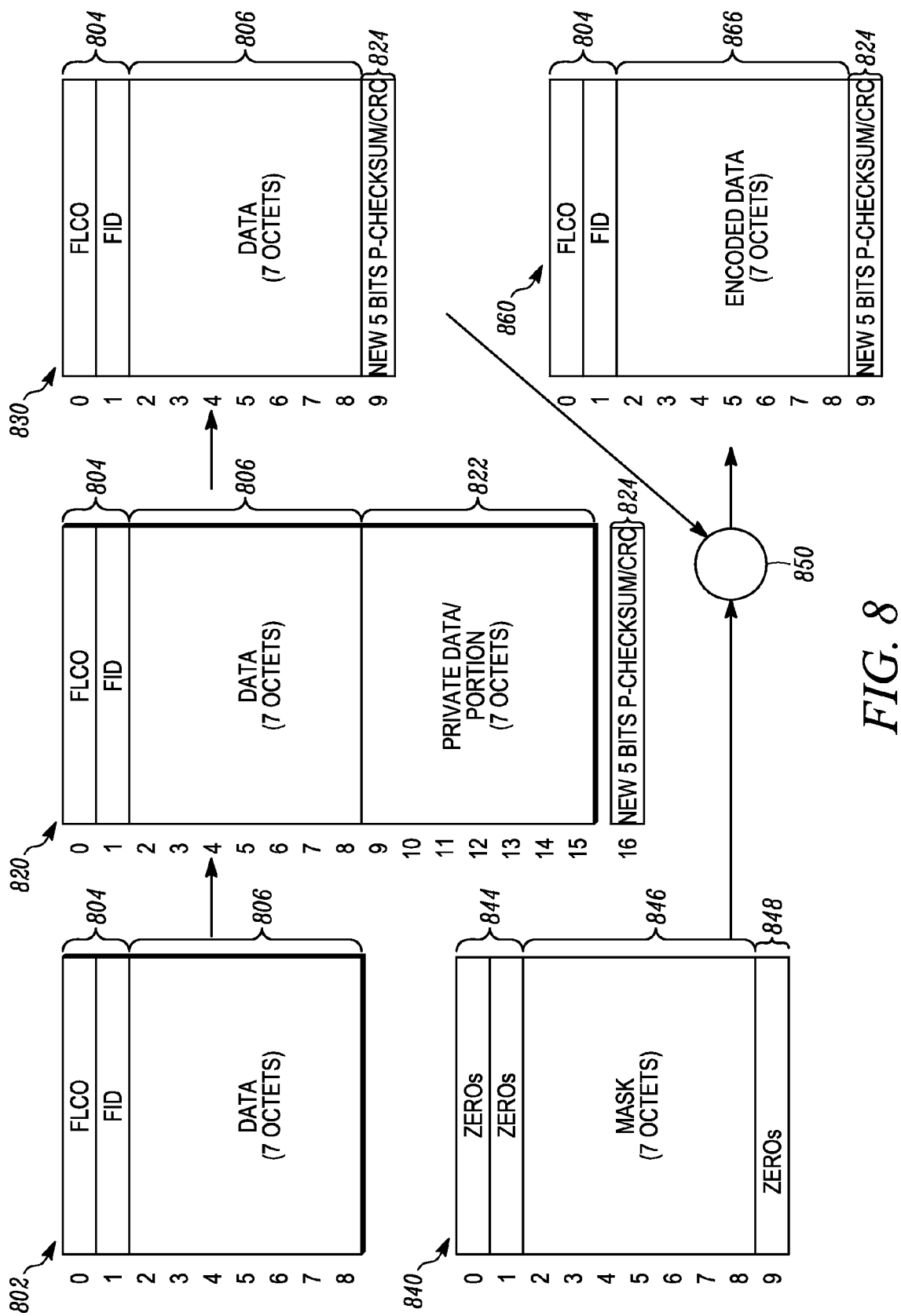
FIG. 8 is a block diagram illustrating a modified example private data concatenation and encoding process implemented at a transmitting device that may be implemented in the system of FIG. 1 when limited space is available or for a more robust CRC or checksum value in accordance with an embodiment.

FIG. 8 illustrates a modified encoding scheme that uses a different additional obfuscation step than that set forth above, and may also be especially useful in those cases (such as with an Embedded LC) that a lower order CRC and/or checksum algorithm must be used, perhaps due to bandwidth, processing power, or power consumption constraints. While the encoding scheme set forth in FIG. 8 may be particularly useful with respect to Embedded LC, as with all of the examples set forth in this disclosure, other messaging structures consistent with other protocol standards could be used in place of the Embedded LC standard messaging examples used herein.

As set forth in FIG. 8, a data burst 802 may be an Embedded LC consistent with the DMR standard and may include a header portion 804 and a data portion 806. The header portion may include a full link control opcode (FLCO) field that defines the purpose and format of the message and a feature set ID field FID that identifies one or more manufacturer specific feature sets.

Next, a first intermediate modified burst 820 is created by appending a first portion of a locally-stored private data as a private data portion 822 to an end of the data portion 806. Similar to FIG. 4, the private data portion 822 could be comprised of a pre-defined arrangement and number of binary, decimal, hexadecimal, or other character encodings that preferably has high entropy (e.g., low amount of repetition of the same character sequences, a large character set to choose from, etc.). For example, for a 56-bit private data, the first portion could comprise all 56-bits (7 bytes) of the private data populated into the private data portion 822. In other examples, only a portion of the entire 56-bit key could be appended. Larger or smaller private data could be used as well.

Of course, the entire or sub-portions of the private data portion 822 could additionally or alternatively be inserted in-between the header portion 804 and the data portion 806 or at some pre-determined point within the data portion 806. After appending the private data portion 822, a P-CRC or P-checksum value is calculated over at least a portion of the header data 804 and the data portion 806 and at least a portion of the private data portion 822. In this example, and in compliance with the checksum size requirements of the DMR standard for Embedded LC messages, a 5-bit P-checksum is calculated over all 16 bytes of the header portion 804, data portion 806, and private portion 822 and populated in a P-CRC/checksum field 824. Subsequently, the private data portion 822 is removed and a second intermediate modified burst 830 is created that includes the header portion 804, the data portion 806, and the P-CRC/checksum field 824 including, in this example, the newly calculated 5-bit P-checksum value.

In addition, a mask burst 840 is created for application to the second intermediate modified burst 830 via a logical Boolean operation such as a logical XOR process 850. The mask burst 840 may be created in any number of ways. In one example, and in order to maintain the header information in a useful state, a header portion 844 of the mask burst 840 corresponding to the header portion 804 of the second intermediate burst 830 is zeroed out (populated with logical 0 bit values) in order to avoid any modifications to the header portion 804 via the logical XOR process 850. Similarly, an P-CRC/checksum field 848 of the mask burst 840 is also zeroed out in order to avoid any modifications to the P-CRC/checksum field 824 already populated with the 5-bit P-checksum calculated over the private data portion 822 (and the header portion 804 and data portion 806). In one example, the mask payload portion 846 of the mask burst 840 corresponding to the data portion 806 of the second intermediate data burst 830 may be populated with a predetermined set of bits, known to both the transmitting device and receiving device, so as to vary particular bits (but not all and not none) of the data portion 806 of the second intermediate data burst 830 before being populated into a final data portion 866 of a final data burst 860 for transmission.

In at least another example, an encoding process using a data ring similar to that already set forth above with respect to FIG. 5 may be used to populate the mask payload portion 846 of the mask burst 840. For example, a 104 bit data ring may be populated with portions of a private data (e.g., the same or different private data as was used to populate the private data portion 822) and a predetermined number of constant values. For example, the first-fifth most significant bytes of the private data may be populated into the data ring at various positions. Remaining positions in the data ring may be populated with 64 bits of pre-determined constants that can prevent mask payload portion 846 of the mask burst 840 from containing all 0's or all 1's and more predictably modifying the data portion 806 of the second intermediate burst. Of course, other combinations of constants and private data portions could be used as well.

A value stored in a pre-determined portion of the private data (e.g., perhaps in the least significant 32 bits of the private data), or in another private data, may provide a count value that defines an extraction period in a clockwise or counter-clockwise direction (extraction direction) around the data ring. In this example, a 104-bit master mask is then constructed as bits are extracted from the data ring in accordance with the count value and the predefined extraction direction. For example, if position 0 occurs at the 12:00 position in the data ring, and the count proceeds in a clockwise manner and ends at 103 (after which position 0 is reached again), and the count value stored in the second portion of the private data (or in the another private data) is 4, the sequence of the encoded bits in the 104-bit mask would be (relative to their position in the data ring): 3, 7, 11, 15, . . . , 99, 103, 4, 9, . . . , 100, 1, 8, 16, 22, . . . etc. Once the 104-bit master mask is created, the first (most significant) 56-bits are analyzed to determine if they are not all 0's, and if not, the mask payload portion 846 of the mask burst 840 is populated with the 56 most significant bits of the 104-bit master mask. Otherwise, the 56 least significant bits of the 104-bit master mask are populated into the mask payload portion 846. By careful selection of non-zero constants in the data ring, one of at least the 56 most significant bits and the 56 least significant bits of the 104-bit mask can be guaranteed to be non-zero, effectively guaranteeing a modification of data between the second intermediate data burst 830 and the final data burst 860 for transmission.

Once the mask burst 840 is created, it is logically XOR'd with the second intermediate data burst 830 via XOR process 850 (e.g., a calculation executed on the processor 213 or processor 313 of the BS 101 or SU 105, for example) and a final data burst 860 for transmission is created including the original data burst header 804 from the data burst 802, a final data portion 866 that is an XOR'd result of the logical bit-wise XOR of the mask payload portion 846 of the mask burst 840 and the data portion 806 of the second intermediate data burst 830, and the P-CRC/checksum field 824 including the newly calculated 5-bit P-checksum value calculated over the private data portion 822. Even though a more limited (5-bit) P-checksum value is used in this example, which may be more prone to brute force determination of the private data used in the private data portion 822, by applying an additional obfuscation step in which the data portion 806 is modified via a non-microprocessor intensive bit-wise logical process (e.g., the reversible XOR process), it becomes much more difficult to use brute force to determine the private data value used in the private data portion 822. Other advantages are possible as well. Due to the symmetry of the XOR bit-wise process, a similar process as set forth in FIG. 8 can be used to authenticate a received data burst that has been encoded consistent with the process set forth in FIG. 8. A receiving device, having knowledge of the method of creating the mask burst 840 including the mask payload portion 846 at the transmitting device, can create the same mask using the same private data and encoding process, and apply the mask to the data portion of the received data burst to recreate the original data. The same private data portion used at the transmitting device can then be appended to the original data, and the P-checksum calculated over the original data and the private data portion. If the calculated P-checksum matches the P-checksum in the received data burst, the data burst is authenticated and further processed. If the calculated P-checksum does not match the P-checksum in the received data burst, the data burst is not authenticated and is not further processed. Similar to the private data, the mask used (or the algorithm for creating the mask and/or the constants used in the mask) is never sent over-the-air in order to prevent the information from being intercepted.

II. Transmitting, Receiving, and Authenticating Data Bursts

Figure 9:
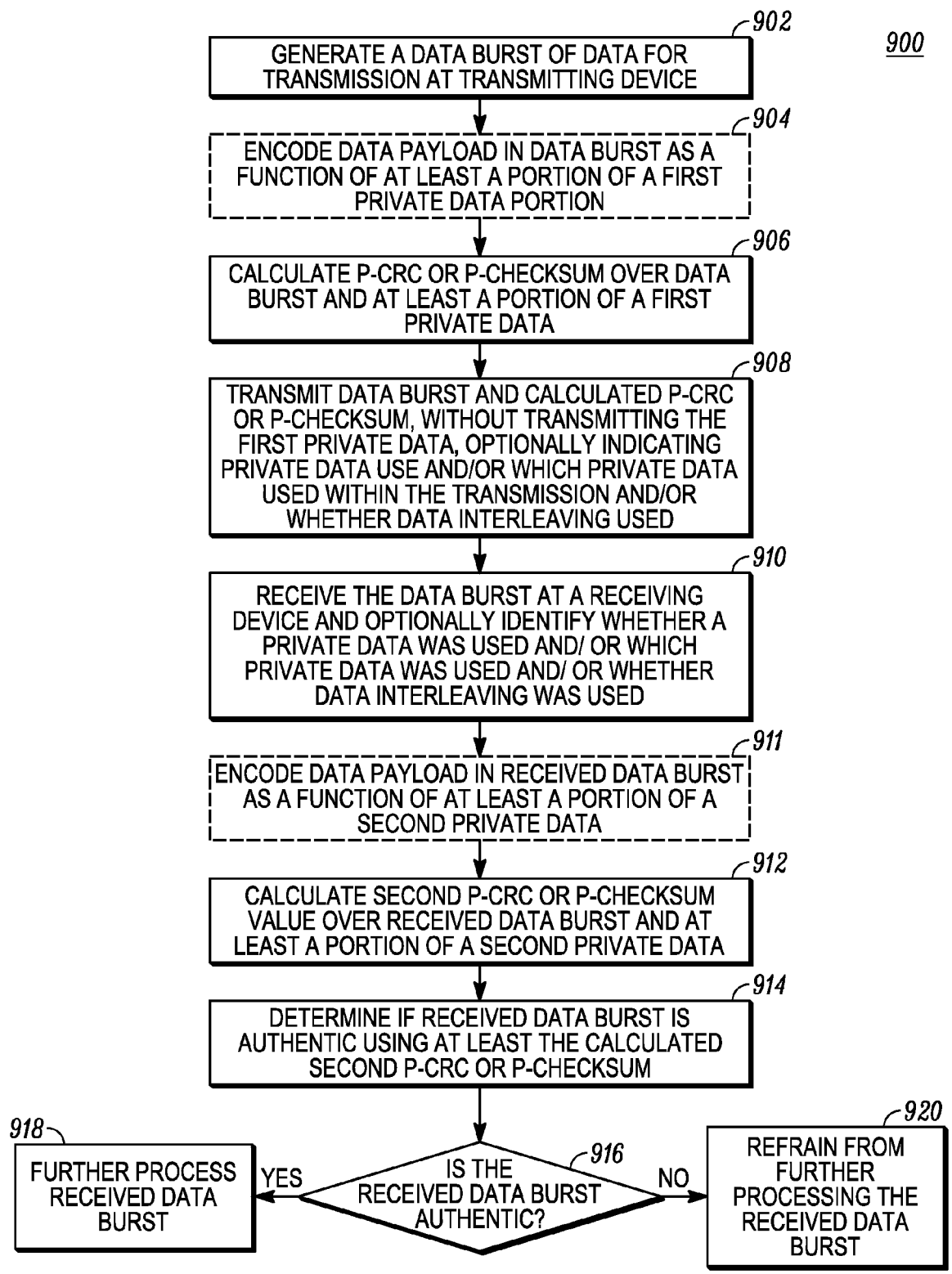
FIG. 9 is a flow chart illustrating an example private data concatenation process that may be implemented at a receiving and transmitting device that may be implemented in the system of FIG. 1 in accordance with an embodiment.

FIG. 9 is a flowchart illustrating a process 900 used by one of a SU and BS (e.g., the transmitting or receiving device) to generate, encode, transmit, receive, decode, and/or authenticate data bursts (e.g., CSBKs, LCs, Embedded LCs, etc.) consistent with the data burst structures set forth above. FIG.

9 sets forth a process 900 including both transmitting steps (steps 902-908) and receiving steps (steps 910-920). In the example set forth in detail below, a first device (transmitting device) transmits a data burst and a second different device (receiving device) receives the data burst. Of course, other sequences are possible as well, and in one example, the transmitting steps (902-908) may be executed by a transceiving device on a first data burst and the receiving steps (910-920) may be executed at the same transceiving device on a second data burst transmitted by some other device and received at the transceiving device.

At step 902, the transmitting device (e.g., perhaps one of the SU or BS) generates a first data burst, perhaps consistent with the data burst 402 set forth in FIG. 4, for over-the-air transmission to a receiving device (e.g., perhaps the other of the SU or BS). At optional step 904, and perhaps consistent with the data burst encoding processes set forth in FIGS. 5 and/or 8, the transmitting device may encode at least a data payload portion in the data burst as a function of at least a portion of a first and/or second private data.

At step 906, the transmitting device calculates a P-CRC or P-checksum over at least a portion of a data portion of the data burst and at least a portion of a first private data appended to the data burst (a same or different portion of a same or different private data as used in optional step 904). At step 908, the transmitting device transmits the data burst and calculated P-CRC or P-checksum towards the destination device, without transmitting the first private data (and, if encoded, details regarding the encoding process and/or any second private data). The data burst may be transmitted over-the-air in accordance with the ETSI-DMR standard, in which the data burst is divided into two with a sync (e.g., frame sync) or embedded signaling (e.g., link control, reverse channel, null embedded message, etc.) there between. In other examples, the data burst may be embedded in, and transmitted across, a plurality of voice bursts (e.g., embedded in the plurality of voice bursts perhaps consistent with a DMR Embedded LC transmission). Other transmission standards and protocols could be used as well.

In at least some embodiments, the transmission may also include an indication of whether or not the CRC or checksum transmitted with the data burst was calculated using a private data portion or not, and if so, may or may not also include an indication (ID) of which private data, out of a plurality of possible private data, was used in the transmitting device to calculate the P-CRC or P-checksum. In at least one example, one or more reserved bits (R(0)-R(2)) in an ETSI-DMR compliant block product turbo code (BPTC) (196,96) formatted transmission may be repurposed to indicate whether or not the CRC or checksum transmitted with the data burst was calculated using a private data portion or not, and/or which of a plurality of possible private data was used to calculate the P-CRC or P-checksum in the transmitting device. In at least another example, more specifically applicable to Embedded LC transmissions where the BPTC reserved bits are not available under the ETSI-DMR standard, one or more bits of the Embedded LC link control opcode (LCO) field may be repurposed to similarly indicate whether or not the CRC or checksum transmitted with the data burst was calculated using a private data portion or not, and/or which of a plurality of possible private data was used to calculate the P-CRC or P-checksum in the transmitting device. In other embodiments, which of a plurality of private data was used for encoding a data burst or for calculating a P-CRC or P-checksum may be implied by other radio system variables, such as a transmitter device subscriber ID, a receiver device subscriber ID, a talkgroup ID, a system color code ID, of any combination of the foregoing. For example, a subscriber unit that is a member of two groups may be configured to use a first private data for communications (transmitting and receiving) with the first of the two groups, and a second private data for communications with the second of the two groups. Other possibilities exist as well.

At step 910, the receiving device (e.g., the other of the SU and BS) receives the transmitted data burst with an appended received P-CRC or P-checksum. The data burst may be received, for example, in a single voice or data burst consistent with the DMR standard, or across a plurality of voice or data bursts (e.g., embedded in the plurality of voice or data bursts perhaps consistent with a DMR Embedded LC transmission) and reassembled at the receiving device from the plurality of voice or data burst frames. The receiving device may attempt to determine from the received transmission, perhaps via the reserved bits (R(0)-R(2)) or the Embedded LC LCO field, whether or not a private data was used by the transmitting device to generate the received P-CRC or P-checksum, and perhaps which of a plurality of private data was used by the transmitting device to generate the received P-CRC or P-checksum. Of course, in the event that private data indicators in the received transmission are present and indicate that no private data was used, normal data burst processing may be implemented and the remaining steps 912-920 not executed (not shown in FIG. 9).

At optional step 911, the receiving device, and perhaps consistent with the data burst authentication processes set forth in FIGS. 5, 7, and/or 8, may similarly encode at least a data payload portion in the received data burst as a function of at least a portion of a second private data.

Assuming that private data indicators in the received transmission are present and indicate that a private data was used, or assuming that the receiving device is configured to always authenticate received data bursts using a private data, at step 912, the receiving device calculates a second P-CRC or P-checksum value over at least a portion of a data payload of the received data burst and at least a portion of the second private data (a same or different portion of a same or different private data as used in optional step 911). The second private data is a locally stored key that approximates or is equivalent to the first private data used at the transmitting device. For example, the second private data and the first private data may consist of a same pattern of binary, decimal, hexadecimal, or other character encodings, and both may be pre-provisioned at the transmitting device and the receiving device before they are placed into operation via a provisioning or configuration process.

The algorithm used at the receiving device to calculate the second P-CRC or P-checksum value is the same algorithm used at the transmitting device, and may be pre-configured or may be indicated in one or more additional bits in the transmission (including, for example, the reserved bits (R(0)-R(2)) or the Embedded LC link control opcode (LCO) field).

The second P-CRC or P-checksum value calculated at step 912 may vary based on which of one or more authentication method are implemented at the receiving device. In a first example, the second P-CRC or P-checksum value may be a check value calculated over the at least a portion of a data payload of the received data burst and at least a portion of the second private data, but not over the corresponding received P-CRC or P-checksum appended to the received data burst (and which will be compared to the received P-CRC or P-checksum appended to the received data burst to see if they match in a later step). In a second example, the second P-CRC or P-checksum value may be a result of adding at least a portion of (or all of) a data payload of the received data burst, at least a portion of (or all of) the second private data, and at least a portion of (or all of) the corresponding received P-CRC or P-checksum appended to the received data burst (and which will be compared to a predetermined value, such as zero, to see if they match in a later step).

At step 914, the receiving device determines if the received data burst is authentic using at least the calculated second P-CRC or P-checksum value from step 912. In accordance with the first example set forth in step 912, determining if the received data burst is authentic may include comparing the calculated second P-CRC or P-checksum value to the received P-CRC or P-checksum, and if they match, determining that the received data burst is authentic, otherwise, determining that the received data burst is not authentic. In accordance with the second example set forth in step 912, determining if the received data burst is authentic may include comparing the calculated second P-CRC or P-checksum value to a predetermined value (such as zero), and if they match, determining that the received data burst is authentic, otherwise, determining that the received data burst is not authentic. Other possibilities exist as well.

If the receiving device determines at step 916 that the received data burst is authentic, processing proceeds to step 918, where the receiving device determines that the received data burst is authentic and allows further processing of the received data burst. Further processing of the received data burst at a SU receiving device may include, for example, playing back audio or other media data included in the transmission, or decoding and processing control or signaling data included in the transmission, among other possibilities. Further processing of the received data burst at a BS receiving device may include, for example, forwarding the data burst to its intended destination, including forwarding the data burst to one or more other BSs, a console, or one or more other SUs within the BS's coverage area, among other possibilities.

If, on the other hand, the receiving device determines at step 916 that the received data burst is not authentic, processing proceeds to step 920, where the receiving device determines that the received data burst is not authentic and refrains from further processing of the received data burst. Refraining from further processing of the data burst may include simply dropping the transmission (or, e.g., refraining from unmuting), or may include dropping the transmission and transmitting a response to the transmitting device indicating that the data burst failed authentication (perhaps via a transmitted NACK), and additionally perhaps a message requesting re-transmission. Other possibilities exist as well.

In one example in which the steps set forth in FIG. 9 may be applied, a SU such as SU 105 of FIG. 1 may execute the transmitting steps 902-908, and a BS such as BS 101 may execute the receiving steps 910-920, or vice versa. In one embodiment, the processes set forth in FIG. 9 may be applied bi-directionally (e.g., on downlink communications from the BS 101 to the SU 105 and on uplink communications from the SU 105 to the BS 101). In other embodiments, the processes set forth in FIG. 9 may be applied uni-directionally and only on select communications from those SUs such as SU 105 that have been configured to support the private CRC/checksums (generated using private data) set forth above. By continuing to transmit traditional CRC/checksums on the downlink (e.g., not calculated using private data and/or encodings consistent with the foregoing disclosure) while supporting both traditional CRC/checksums (e.g., not calculated using private data and/or encodings consistent with the foregoing disclosure) and private CRC/checksums (e.g., calculated using private data and/or encodings consistent with the foregoing disclosure) on the uplink, a wireless communication system 100 operator can more easily migrate a traditional CRC/checksum process to the private CRC/checksum process set forth herein. In the latter case, a receiving BS such as BS 101 may use information embedded in the transmission (such as the reserved bits or Embedded LC LCO) to determine whether a received data burst is using the traditional or the private CRC/checksum (and thus which process to use to authenticate/validate the received burst), or may authenticate/validate the received data burst using both processes (serially or in parallel) and further process the received burst as long as at least one process indicates an authentic/error-free data burst. Other possibilities exist as well.

III. Conclusion

In accordance with the foregoing, a wireless communication system and method is disclosed that prevents access to the radio system by an unauthorized subscriber unit at the beginning of the call (without requiring additional authentication exchanges and the inherent delays involved in such additional exchanges) and/or throughout the call (by encoding all transmissions in the manner cited above). Accordingly, the disclosed system and method restricts digital two-way radio system access to its own subscriber units with minimum overhead, while preventing unauthorized subscriber units from listening to an established call, without the additional timing overhead of a registration/authentication process, and without allowing an unauthorized subscriber unit using a duplicate subscriber unit ID to use the system. While requiring minimum overhead to process, the difficulty in working backwards from a received or intercepted private CRC to obtain the private data, and the difficulty in brute-force guessing the private data, prevents unauthorized subscriber units from using system resources absent an extended, coordinated attack and robust processing power that is not available on a routine basis.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. In a two-way radio frequency (RF) communications system having at least one fixed terminal, one or more channels, and a plurality of subscriber units, the method comprising, at a first subscriber unit:

generating a first burst of media data for transmission to the at least one fixed terminal;

calculating one of a cyclic redundancy check (CRC) value and a checksum value over (i) at least a first portion of the first burst of media data and (ii) at least a portion of a first private data, wherein the first private data is identical to a second private data stored locally at the at least one fixed terminal; and transmitting the first burst of media data and the one of the calculated CRC and checksum value, but not the first private data, to the at least one fixed terminal.

2. The method of claim 1, further comprising, at the first subscriber unit:

receiving a second burst of media data, different from the first burst of media data, from the at least one fixed terminal with one of an appended CRC value and appended checksum value appended to the received first burst of media data from the first subscriber unit;

calculating one of a second CRC value and a second checksum value over both (i) at least a first portion of the second burst of media data and (ii) at least a portion of a second private data stored locally at the first subscriber unit;

determining if the second burst of media data is authentic using at least the one of the calculated second CRC value and the calculated second checksum value;

if the determination is that the second burst of media data is authentic, further decoding the second burst of media data, otherwise, refraining from further decoding the second burst of media data.

3. The method of claim 1, further comprising, at the at least one fixed terminal:

receiving the first burst of media data from the first subscriber unit with one of an appended CRC value and appended checksum value appended to the received first burst of media data from the first subscriber unit;

calculating one of a second CRC value and a second checksum value over both (i) at least the first portion of the first burst of media data and (ii) at least a portion of a second private data;

determining if the first burst of media data is authentic using at least the one of the calculated second CRC value and the calculated second checksum value;

if the determination is that the first burst of media data is authentic, further decoding the first burst of media data, otherwise, refraining from further decoding the first burst of media data.

4. The method of claim 1, further comprising, prior to calculating the one of the CRC value and the checksum value, encoding at least a portion of a data payload contained within the first portion of the first burst of media data as a function of at least a second portion of the first private data.

5. The method of claim 4, further comprising, at the at least one fixed terminal:

receiving the first burst of media data from the first subscriber unit with one of an appended CRC value and appended checksum value appended to the received first burst of media data from the first subscriber unit;

encoding the at least the portion of the data payload contained within the first portion of the first burst of media data as a function of at least a portion of a second private data;

calculating one of a second CRC value and a second checksum value over both (i) the first portion of the first burst of media data and (ii) at least a second portion of the second private data;

determining if the first burst of media data is authentic using at least the one of the calculated second CRC value and the calculated second checksum value;

if the determination is that the first burst of media data is authentic, further decoding the first burst of media data, otherwise, refraining from further decoding the first burst of media data.

6. The method of claim 1, further comprising determining that the first private data is to be used in the transmission of the first burst of media data, wherein the transmitting comprises setting one or more bits in the transmission of the first burst to indicate the use of the first private data.

7. The method of claim 6, wherein the one or more bits in the transmission of the first burst to indicate the use of the first private data are reserved bits defined by the ETSI-DMR standard for block product turbo code (BPTC) (196,96) formatted transmissions as R(0)-R(2).

8. The method of claim 7, wherein the one or more bits are also used to indicate which one of a plurality of available private data the first private data is equivalent to.

9. In a two-way radio frequency (RF) communications system having at least one fixed terminal, one or more channels, and a plurality of subscriber units, the method comprising, at the fixed terminal:

generating a first burst of media data for transmission to at least a first subscriber unit out of the plurality of subscriber units;

calculating one of a cyclic redundancy check (CRC) value and a checksum value over both (i) at least a first portion of the burst of media data and (ii) at least a portion of a first private data, wherein the first private data is identical to a second private data stored locally at the first subscriber unit of the plurality of subscriber units; and transmitting the first burst of media data and the one of the calculated CRC and checksum value, but not the first private data, to the at least first subscriber unit.

10. The method of claim 9, wherein the calculating comprises calculating the checksum value, and the transmitting comprises embedding the data burst and calculated checksum value across a plurality of voice burst frames.

11. The method of claim 10, further comprising, prior to calculating the checksum value over both the first portion of the first burst of media data and the first private data, encoding at least a portion of a data payload contained within the first portion of the first burst of media data as a function of at least a second portion of the first private data.

12. The method of claim 11, further comprising, at the at least first subscriber unit:

receiving the first burst of media data from the fixed terminal over a plurality of voice burst frames;

extracting and reassembling the first burst from the plurality of voice burst frames;

encoding the at least the portion of a data payload contained within the first portion of the first burst of media data as a function of at least a portion of a second private data;

calculating a second checksum value over both (i) the first portion of the first burst of media data and (ii) at least a second portion of the second private data;

determining if the first burst of media data is authentic using at least the second checksum value;

if the determination is that the first burst of media data is authentic, further decoding the first burst of media data, otherwise, refraining from further decoding the first burst of media data.

13. The method of claim 10, further comprising determining that the first private data is to be used in the transmission of the first burst of media data, wherein the transmitting comprises setting one or more bits in the transmission of the first burst to indicate the use of the first private data.

14. The method of claim 13, wherein the one or more bits are bits defined by the ETSI-DMR standard for link control opcode purposes.

15. The method of claim 13, wherein the one or more bits are also used to indicate which one of a plurality of available private data the first private data is equivalent to.

16. The method of claim 9, wherein the calculating comprises calculating the CRC value, and the transmitting comprises appending the calculated CRC value to an end of the data burst and transmitting the first data burst and appended CRC value to the at least one fixed subscriber unit in a single voice burst frame.

17. In a two-way radio frequency (RF) communications system having at least one fixed terminal, one or more channels, and a plurality of subscriber units, a first subscriber unit configured to:

generate a first burst of media data for transmission to the at least one fixed terminal;

calculate one of a cyclic redundancy check (CRC) value and a checksum value over (i) at least a first portion of the first burst of media data and (ii) at least a portion of a first private data, wherein the first private data is identical to a second private data stored locally at the at least one fixed terminal; and transmit the first burst of media data and the one of the calculated CRC and checksum value, but not the first private data, to the at least one fixed terminal.

18. In a two-way radio frequency (RF) communications system having at least one fixed terminal, one or more channels, and a plurality of subscriber units, a first fixed terminal configured to:

generate a first burst of media data for transmission to at least a first subscriber unit out of the plurality of subscriber units;

calculate one of a cyclic redundancy check (CRC) value and a checksum value over only at least a first portion of the first burst of media data to be transmitted; and transmit the first burst of media data and the one of the calculated CRC and checksum value to the at least first subscriber unit;

receive a second burst of media data, different from the first burst of media data, from a second subscriber unit out of the plurality of subscriber units;

calculate one of a second CRC value and a second checksum value over both (i) at least a first portion of the second burst of media data and (ii) at least a portion of a first private data stored locally at the first fixed terminal, wherein the first private data is identical to a second private data stored locally at the second subscriber unit of the plurality of subscriber units;

determine if the second burst of media data is authentic using at least the one of the second CRC value and the second checksum value;

if the determination is that the second burst of media data is authentic, further decoding the second burst of media data, otherwise, refraining from further decoding the second burst of media data.

* * * * *